(12) United States Patent
Kumar et al.

(10) Patent No.: US 9,923,566 B1
(45) Date of Patent: Mar. 20, 2018

(54) SPREAD SPECTRUM CLOCK GENERATOR

(71) Applicant: STMicroelectronics International N.V., Amsterdam (NL)

(72) Inventors: Anand Kumar, Noida (IN); Gagan Midha, Panipat (IN)

(73) Assignee: STMicroelectronics International N.V., Schiphol (NL)

( * ) Notice: Subject to any disclaimer, the term of this patent is extended or adjusted under 35 U.S.C. 154(b) by 0 days.

(21) Appl. No.: 15/251,065

(22) Filed: Aug. 30, 2016

(51) Int. Cl.
*H03L 7/093* (2006.01)
*H03L 7/099* (2006.01)
*H03L 7/089* (2006.01)
*H03L 7/197* (2006.01)

(52) U.S. Cl.
CPC ............ *H03L 7/093* (2013.01); *H03L 7/0891* (2013.01); *H03L 7/099* (2013.01); *H03L 7/1976* (2013.01)

(58) Field of Classification Search
CPC ....... H03L 7/093; H03L 7/0891; H03L 7/099; H03L 7/01976
USPC ................. 327/156, 157, 158, 161
See application file for complete search history.

(56) References Cited

U.S. PATENT DOCUMENTS

| | | | |
|---|---|---|---|
| 6,844,763 B1 * | 1/2005 | Balboni | H03C 3/0925 327/157 |
| 8,037,336 B2 | 10/2011 | Chawla | |
| 2008/0303566 A1 * | 12/2008 | Shen | H03L 7/193 327/157 |
| 2010/0327916 A1 * | 12/2010 | Ahmadi | H03L 7/1976 327/107 |

* cited by examiner

*Primary Examiner* — John Poos
(74) *Attorney, Agent, or Firm* — Gardere Wynne Sewell LLP

(57) ABSTRACT

A phase or frequency locked-loop circuit includes an oscillator configured to generate an output clock signal having a frequency set by an oscillator control signal. A modulator circuit receives a first signal and a second signal and is configured to generate a control signal having a value modulated in response to the first and second signals. A filter circuit generates the oscillator control signal by filtering the control signal. A delta-sigma modulator circuit operates to modulate the second signal in response to a modulation profile. As a result, the output clock signal is a spread spectrum clock signal.

35 Claims, 3 Drawing Sheets

SPREAD SPECTRUM CLOCK GENERATOR

TECHNICAL FIELD

The present invention relates to a spread spectrum clock generator and, in particular, to a spread spectrum clock generator having a high modulation frequency.

BACKGROUND

System on Chip (SoC) type integrated circuits typically include a digital circuit that operates in response to a clock signal. The evolution of SoC digital circuit designs requires increasing the frequency of the clock signal. However, as the operating frequency of the clock signal increases, the electromagnetic interference (EMI) also increases. This EMI can be a significant concern, especially in consumer electronics, microprocessor-based systems and data transmission circuits. Reduction of EMI is therefore a critical design feature.

There are a number of known EMI reduction schemes including: the use of a shielding box, skew-rate control circuits and spread spectrum clock generation. Of these options, spread spectrum clock generation is an attractive solution because of its lower hardware cost. As a result, the use of spread spectrum clock generation circuit is a common component of many SoC designs.

Reference is made to FIG. 1 showing a conventional configuration for a spread spectrum clock generator circuit 10 based on a phase-lock-loop (PLL) implementation. The circuit 10 receives a reference frequency signal fref that is fed to a first input of a phase difference detector (PDD) 12. A second input of the phase difference detector 12 receives a feedback frequency signal ffb. The phase difference detector 12 determines a difference in phase between the reference frequency signal fref and the feedback frequency signal ffb. The output of the phase difference detector 12 drives a charge pump (CP) circuit 14 which generates a voltage signal indicative of the determined difference in phase. That voltage signal is then filtered by a low pass filter (LPF) 16 to generate a control signal. A control input of a voltage controlled oscillator (VCO) 18 receives the control signal and generates an output clock signal fout. A divider circuit (/N) 20 divides the output clock signal fout by N to generate the feedback frequency signal ffb. The loop circuit accordingly operates to cause the phase of the output clock signal to lock to the phase of the reference frequency signal fref, wherein a frequency of the output clock signal is an integer multiple (N) of the reference frequency signal fref. To implement spread spectrum control over the output clock signal, the divider value N is modulated by a sigma-delta (ΣΔ) modulator circuit 22. The designation of the modulation profile is provided through an input signal to the sigma-delta modulator circuit 22 that may, for example, have a triangular wave profile. The amplitude and frequency of the modulation profile may be controlled.

FIG. 2 shows a conventional configuration for a spread spectrum clock generator circuit 30 based on a frequency-lock-loop (FLL) implementation. A count difference (CD) circuit 32 receives a reference count Cref at a first input and a feedback count Cfb at a second input. The count difference circuit 32 is a digital circuit that operates to determine a difference in the received count values. That difference value is then filtered by a digital low pass filter (LPF) 34 to generate a digital control signal. A digital-to-analog converter (DAC) circuit 36 converts the digital control signal to an analog control signal. A control input of a current controlled oscillator (CCO) 38 receives the analog control signal and generates an output clock signal fout. A cycle counter circuit (CCC) 40 receives the output clock signal fout and a reference frequency signal fref. The cycle counter circuit 40 operates to count a number of cycles in the output clock signal fout which occur for each single cycle of the reference frequency signal fref. That count is the feedback count Cfb. The loop circuit accordingly operates to cause a frequency of the output clock signal to lock to an integer multiple of a frequency of the reference frequency signal fref, wherein the integer multiple is designated by the value of the reference count Cref. To implement spread spectrum control, the reference count Cref is a count with a value of N modulated by a sigma-delta (ΣΔ) modulator circuit 42. The designation of the modulation profile is provided through an input signal to the sigma-delta modulator circuit 42 that may, for example, have a triangular wave profile. The amplitude and frequency of the modulation profile may be controlled.

The triangular wave profile for the input signal to the sigma-delta modulator circuit 22 or 42 provides for a near optimum spreading of the spectrum so as to mitigate EMI effects. The fractional resolution required by spread spectrum clock generator modulation is achieved through the sigma-delta modulator circuit 22 or 42. One problem with this approach is that high frequency modulation cannot be achieved. The spread spectrum clock generator modulation must be at least three times less than the bandwidth of the system circuit 10 or 30 in order to pass at least the third harmonic of the fundamental frequency of the triangular wave. The bandwidth of the system circuit 10 or 30 is mainly a function of the reference frequency signal fref. For example, the maximum bandwidth possible for the PLL implementation is about one-eighth of the reference frequency. If taking into account process, voltage, temperature (PVT) variation of the bandwidth, the ratio is reduced to about one-twenty-fourth. Now further allowing for three harmonics of the triangular wave, the maximum frequency of the spread spectrum clock generator profile would be one-seventy-second.

New SoC designs and new standards will require modulation frequencies up to or above 2 MHz with reference frequencies as low as 32 kHz. The solutions of FIGS. 1 and 2 are not usable. A need accordingly exists for a spread spectrum clock generator having a high modulation frequency. Preferably, operation of the generator is not dependent on reference frequency. Still further, the modulation depth and modulation frequency for the generated spread spectrum clock should be programmable and PVT tolerant.

SUMMARY

In an embodiment, a circuit comprises: a locked-loop circuit including: an oscillator configured to generate an output clock signal having a frequency set by an oscillator control signal; a modulator circuit having a first input configured to receive a first signal and a second input configured to receive a second signal, said modulator circuit configured to generate a control signal having a value modulated in response to said first and second signals; and a filter circuit configured to generate said oscillator control signal by filtering the control signal; and a delta-sigma modulator circuit configured to modulate the second signal in response to a modulation profile so that said output clock signal is a spread spectrum clock signal.

In an embodiment, a spread spectrum clock generation circuit comprises: a phase-lock-loop circuit including an input configured to receive a reference frequency signal and an oscillator configured to output a spread spectrum clock signal having a frequency controlled by an oscillator control signal and phase locked to said reference frequency signal; and a sigma delta modulator circuit having an input configured to receive a modulation profile signal, said sigma delta modulator circuit configured to apply a modulation to said oscillator control signal in response to said modulation profile signal.

In an embodiment, a spread spectrum clock generation circuit comprises: a frequency-lock-loop circuit including an input configured to receive a reference frequency signal and an oscillator configured to output a spread spectrum clock signal having a frequency controlled by an oscillator control signal and frequency locked to an integer multiple of said reference frequency signal; and a sigma delta modulator circuit having an input configured to receive a modulation profile signal, said sigma delta modulator circuit configured to apply a modulation to said oscillator control signal in response to said modulation profile signal.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 3:
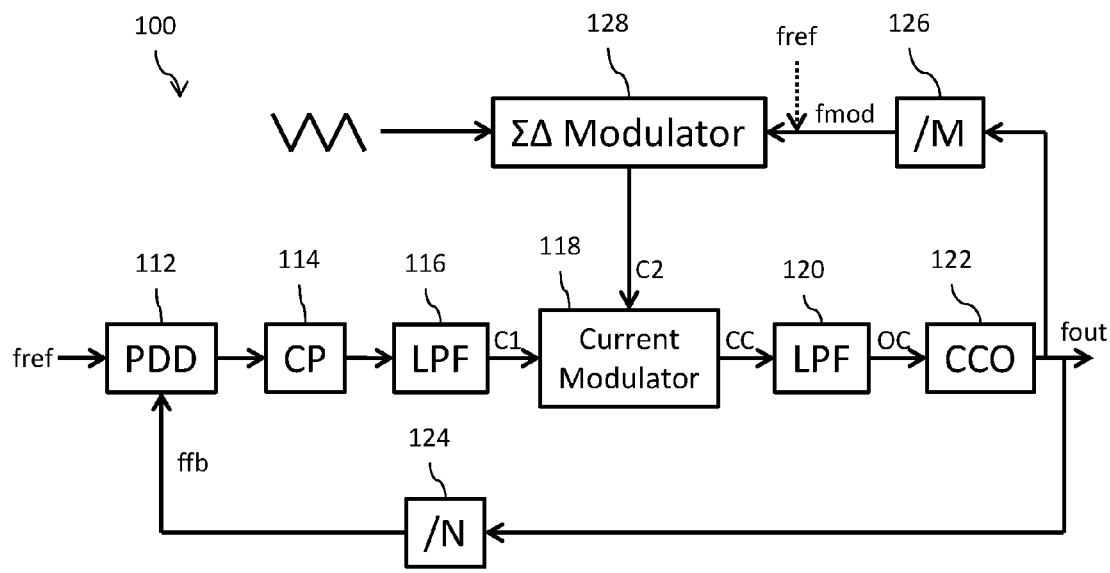
FIG. 3 shows a spread spectrum clock generator circuit based on a phase-lock-loop (PLL) implementation.

Reference is now made to FIG. 3 showing a spread spectrum clock generator circuit 100 based on a phase-lock-loop (PLL) implementation. The circuit 100 receives a reference frequency signal fref that is fed to a first input of a phase difference detector (PDD) 112. A second input of the phase difference detector 112 receives a feedback frequency signal ffb. The phase difference detector 112 determines a difference in phase between the reference frequency signal fref and the feedback frequency signal ffb. The output of the phase difference detector 112 drives a charge pump (CP) circuit 114 which generates a voltage signal indicative of the determined difference in phase. That voltage signal is then filtered by a low pass filter (LPF) 116 to generate a first control signal C1. A first control input of a current modulator circuit 118 receives the first control signal C1. A second control input of the current modulator circuit 118 receives a second control signal C2. The current modulator circuit 118 outputs a current control signal CC having a magnitude that is dependent on both the first and second control signals C1 and C2. That current control signal CC is then filtered by a low pass filter (LPF) 120 to generate an oscillator control signal OC. A control input of a current controlled oscillator (CCO) 122 receives the oscillator control signal and generates an output clock signal fout having a frequency that is dependent on the oscillator control signal. A divider circuit (/N) 124 divides the output clock signal fout by N to generate the feedback frequency signal ffb. A divider circuit (/M) 126 divides the output clock signal fout by M to generate a clock signal fmod. A sigma-delta (ΣΔ) modulator circuit 128 includes a clock input that receives the clock signal fmod. The designation of the modulation profile is provided through an input signal to the sigma-delta modulator circuit 128 that may, for example, have a triangular wave profile. The amplitude and frequency of the modulation profile may be controlled. The sigma-delta modulator circuit 128 operates to modulate the second control signal C2 in accordance with the modulation profile for application to the current modulator circuit 118.

In an alternative embodiment, as shown in the figure, the clock signal fmod for the sigma-delta modulator circuit 128 may instead by provided by the reference frequency signal fref.

Figure 4:
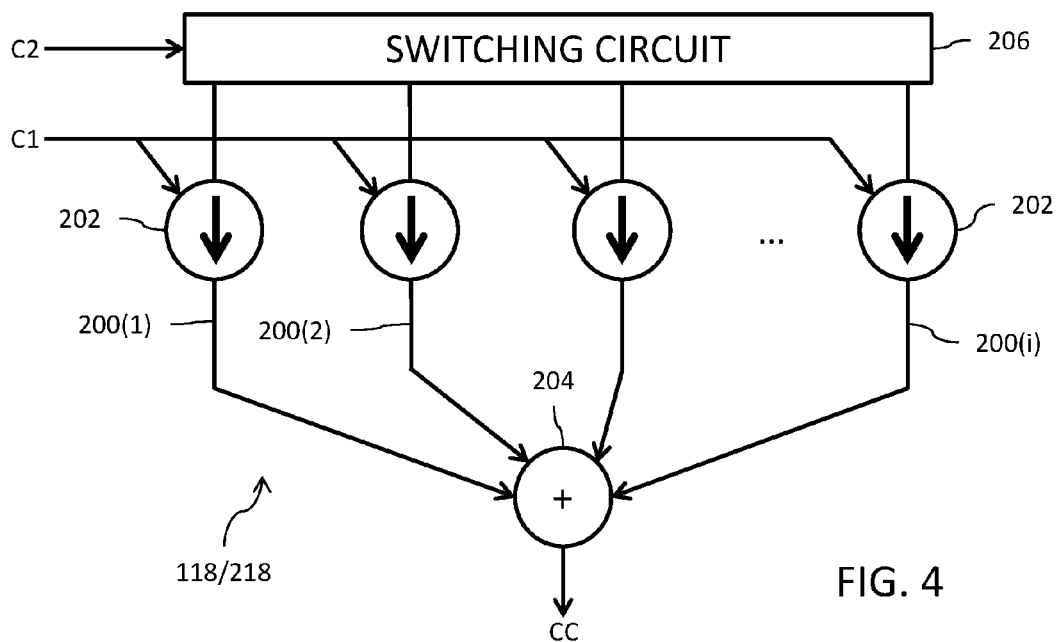
FIG. 4 is a block diagram of the current modulator circuit.

FIG. 4 shows a block diagram of the current modulator circuit 118. The circuit 118 includes a plurality of current branches 200(1)-200(i). Each branch includes a current source 202 biased by the first control signal. A current summing circuit 204 sums the currents that are output from the current sources 202 to generate the current control signal CC. A switching circuit 206 controlled by the second control signal C2 selectively actuates the current sources 202. The second control signal C2 may, for example, be a multibit digital signal wherein each bit is configured to control a switch within the switching circuit 206 to actuate a corresponding current source 202. Alternatively, the digital signal may be decoded to generate signals for actuating switches of the switching circuit 2016.

In an example embodiment, the current source 202 in branch 200(1) is always on and is configured to source a current that is 90% of a reference current Iref to the current control signal CC. A magnitude of the reference current Iref is set by the first control signal C1 which biases the operation of each one of the current sources 202. Each of the current sources 202 in the branches 200(2)-200(i) is configured to source a current that is 1% of the reference current Iref. If i=21, then the twenty current sources 202 in the branches 200(2)-200(i) will each selectively contribute 1% of the reference current Iref to the current control signal CC. The twenty current sources 202 in the branches 200(2)-200(i) are selectively actuated by the switching circuit 206 in response to the bits of the second control signal C2. The magnitude of the current control signal CC is accordingly modulated by the combination of the first control signal C1 (which modulates the reference current Iref through the biasing of the current sources 202 for all branches 200) and the second control signal C2 (which modulates through the selective actuation of the current sources 202 in the branches 200(2)-200(i)). The current control signal CC is accordingly modulated over a range from 0.9×Iref to 1.1×Iref.

When no modulation is required, ten of the current sources 202 in the branches 200(2)-200(i)) are actuated along with the current source 202 in branch 200(1) to provide the current control signal CC at 100% of Iref. When a modulation profile for spread spectrum clock generation is desired, the sigma-delta modulator circuit 128 modulates the branches 200(2)-200(i)) though second control signal C2 control of the switches within the switching circuit 206 to produce the desired modulation depth in percentage of the current Iref locked to the reference frequency. For a second order modulator, the total output spread for an input spread of 0 to 1 would be +3 to −2. So, in this configuration, the second order modulator would achieve a +7 to −8% modulation depth.

Figure 1:
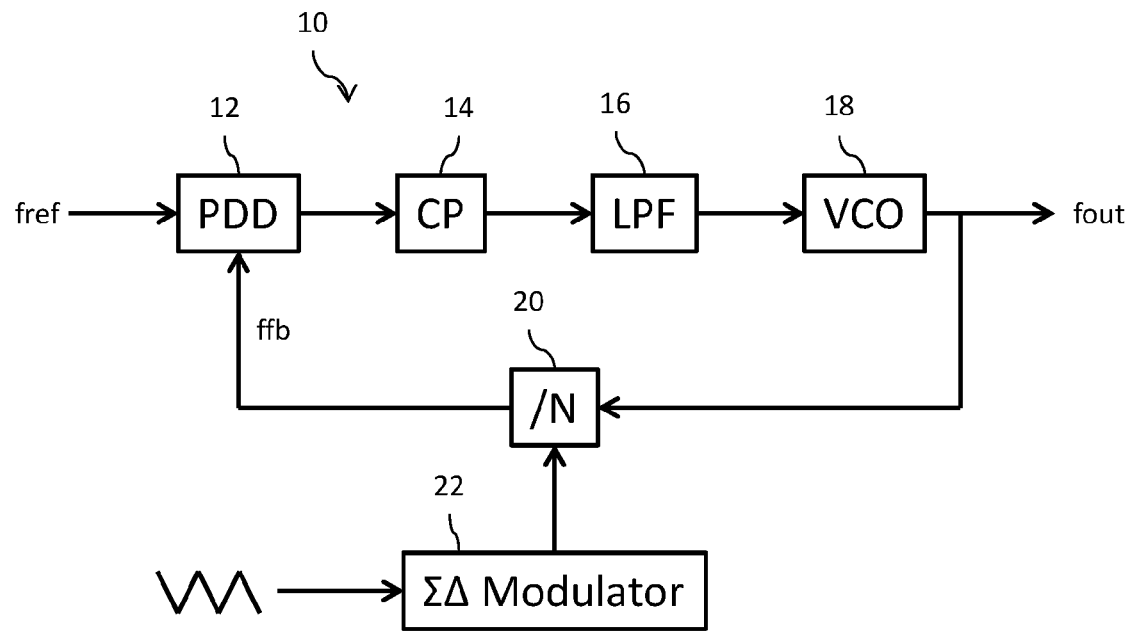
FIG. 1 shows a conventional configuration for a spread spectrum clock generator circuit based on a phase-lock-loop (PLL) implementation.

The circuit 100 differs from the circuit 10 of FIG. 1 in that the modulation profile is introduced at the input of the current controlled oscillator 122. This configuration supports the use of higher modulation frequencies.

Figure 5:
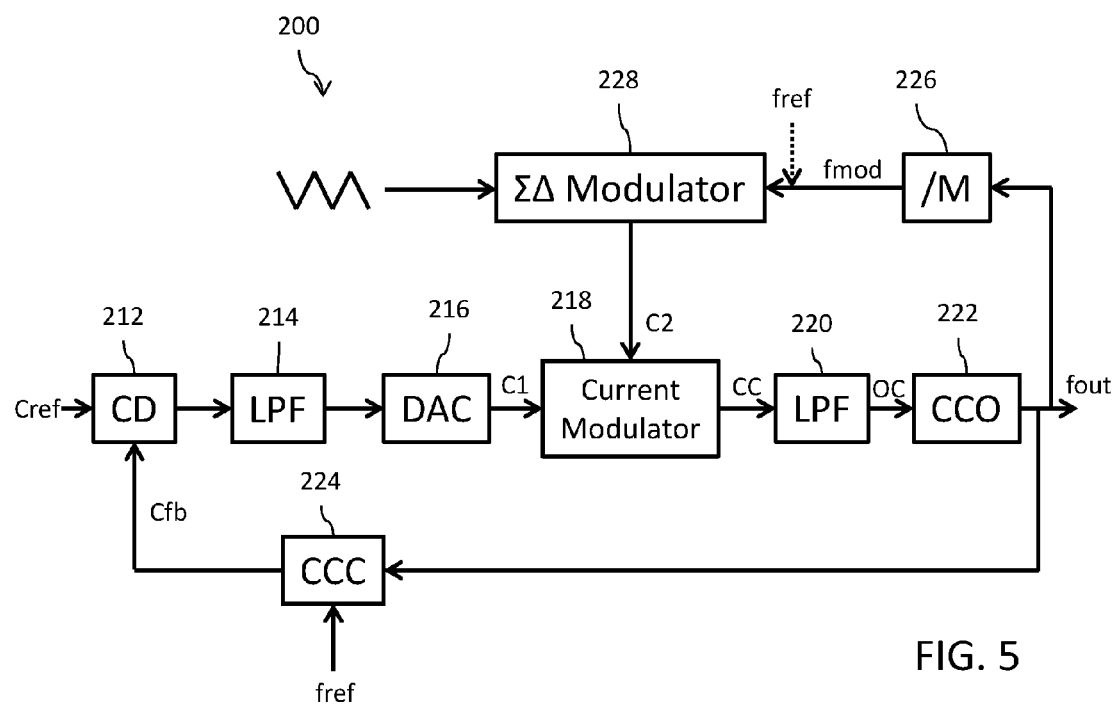
FIG. 5 shows a spread spectrum clock generator circuit based on a frequency-lock-loop (FLL) implementation.

Reference is now made to FIG. 5 showing a spread spectrum clock generator circuit 200 based on a frequency-lock-loop (FLL) implementation. A count difference (CD) circuit 212 receives a reference count Cref at a first input and a feedback count Cfb at a second input. The count difference circuit 212 is a digital circuit that operates to determine a difference in the received count values. That difference value is then filtered by a digital low pass filter (LPF) 214 to generate a digital control signal. A digital-to-analog converter (DAC) circuit 216 converts the digital control signal to an analog first control signal C1. A first control input of a current modulator circuit 218 receives the first control signal C1. A second control input of the current modulator circuit 218 receives a second control signal C2. The current modulator circuit 218 outputs a current control signal CC having a magnitude that is dependent on both the first and second control signals C1 and C2. That current control signal CC is then filtered by a low pass filter (LPF) 220 to generate an oscillator control signal OC. A control input of a current controlled oscillator (CCO) 222 receives the oscillator control signal and generates an output clock signal fout. A cycle counter circuit (CCC) 224 receives the output clock signal fout and a reference frequency signal fref. The cycle counter circuit 224 operates to count a number of cycles in the output clock signal fout which occur for each single cycle of the reference frequency signal fref. That determined count is the feedback count Cfb. The loop circuit accordingly operates to cause a frequency of the output clock signal to lock to an integer multiple of the reference frequency signal fref, wherein the integer multiple is designated by the reference count Cref. A divider circuit (/M) 226 divides the output clock signal fout by M to generate a clock signal fmod. A sigma-delta (ΣΔ) modulator circuit 228 includes a clock input that receives the clock signal fmod. The designation of the modulation profile is provided through an input signal to the sigma-delta modulator circuit 228 that may, for example, have a triangular wave profile. The amplitude and frequency of the modulation profile may be controlled. The sigma-delta modulator circuit 228 operates to modulate the second control signal C2 in response to the modulation profiled for application to the current modulator circuit 218.

In an alternative embodiment, as shown in the figure, the clock signal fmod for the sigma-delta modulator circuit 128 may instead be provided by the reference frequency signal fref.

FIG. 4 shows a block diagram of the current modulator circuit 218.

Figure 2:
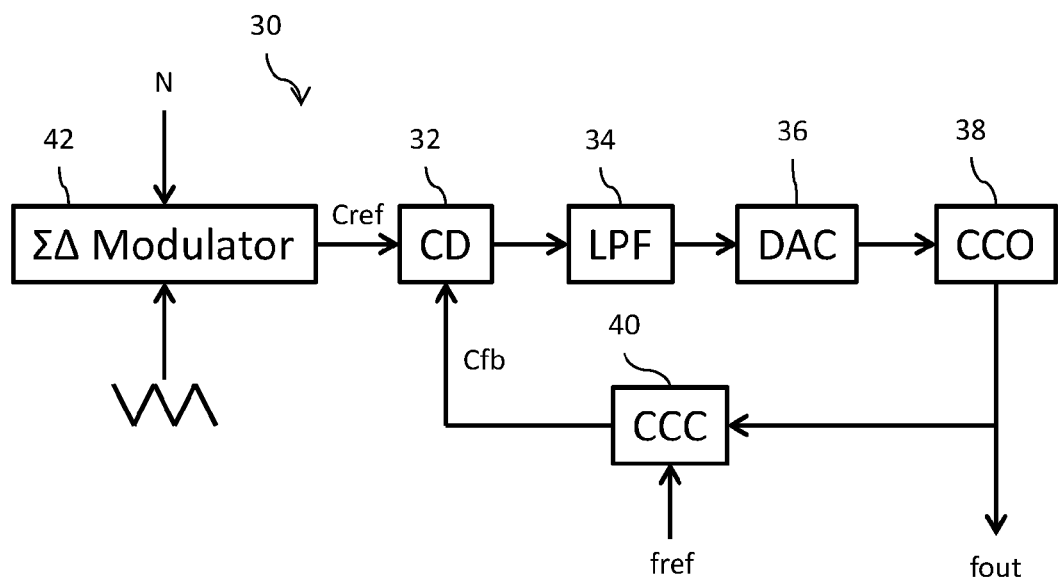
FIG. 2 shows a conventional configuration for a spread spectrum clock generator circuit based on a frequency-lock-loop (FLL) implementation.

The circuit 200 differs from the circuit 30 of FIG. 2 in that the modulation profile is introduced at the input of the current controlled oscillator 122. This configuration supports the use of higher modulation frequencies.

As PVT variation changes, the current flowing into the current controlled oscillator 122 or 222 with oscillator control signal OC also changes to adjust for gain variation and keep the output clock signal fout locked (in phase, frequency or both). The desired modulation profile is the percentage of the total frequency, and the modulation of the current control signal CC in the same percentage would achieve that purpose. This holds true if the current to frequency transfer function is linear. Such is the case for a ring oscillator implemented as the current controlled oscillator 122 or 222.

The sigma-delta modulator circuit 128 or 228 operates at an oversampled rate set by the clock signal fmod (or reference clock frequency fref in the alternative embodiment). The current control signal CC generated by the current summing circuit 204 is passed through the low pass filter 120 or 220 that is at least a second order filter (and is more preferably a third order filter) so as to ensure that the high frequency sigma-delta modulator quantization noise is effectively filtered out of the oscillator control signal OC.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A circuit, comprising:
   a locked-loop circuit including:
   an oscillator configured to generate an output clock signal having a frequency set by a first oscillator control signal;
   a modulator circuit having a first input configured to receive a second oscillator control signal and a second input configured to receive a spread spectrum modulation control signal, said modulator circuit configured to generate a third oscillator control signal by directly modulating the second oscillator control signal in response to said spread spectrum modulation control signal; and
   a filter circuit configured to generate said first oscillator control signal by filtering the third oscillator control signal; and
   a delta-sigma modulator circuit configured to modulate the spread spectrum modulation control signal in response to a modulation profile so that said output clock signal is a spread spectrum clock signal.

2. A circuit, comprising:
   a locked-loop circuit including:
   an oscillator configured to generate an output clock signal having a frequency set by an oscillator control signal;
   a modulator circuit having a first input configured to receive a first signal and a second input configured to receive a second signal, said modulator circuit configured to generate a control signal having a value modulated in response to said first and second signals; and
   a filter circuit configured to generate said oscillator control signal by filtering the control signal; and
   a delta-sigma modulator circuit configured to modulate the second signal in response to a modulation profile so that said output clock signal is a spread spectrum clock signal,
   wherein the locked-loop circuit is a phase-locked-loop circuit and further includes:
   a phase detector circuit having a first input configured to receive a reference frequency signal and a second input configured to receive a feedback frequency signal, said phase detector circuit configured to detect a phase difference between the reference frequency signal and the feedback frequency signal and output a difference signal;
   a charge pump circuit configured to generate a voltage signal in response to said difference signal, wherein said first signal is derived from said voltage signal; and a divider circuit configured to divide said output clock signal to generate said feedback frequency signal.

3. The circuit of claim 2, wherein said locked-loop circuit further includes a further filter circuit configured to filter said voltage signal to generate said first signal.

4. The circuit of claim 2, wherein said delta-sigma modulator circuit includes a first input configured to receive a clock signal and a second input configured to receive said modulation profile.

5. The circuit of claim 4, wherein said clock signal is a frequency divided version of said output clock signal.

6. The circuit of claim 4, wherein said clock signal is said reference frequency signal.

7. A circuit, comprising:
a locked-loop circuit including:
an oscillator configured to generate an output clock signal having a frequency set by an oscillator control signal;
a modulator circuit having a first input configured to receive a first signal and a second input configured to receive a second signal, said modulator circuit configured to generate a control signal having a value modulated in response to said first and second signals; and
a filter circuit configured to generate said oscillator control signal by filtering the control signal; and
a delta-sigma modulator circuit configured to modulate the second signal in response to a modulation profile so that said output clock signal is a spread spectrum clock signal,
wherein the locked-loop circuit is a frequency-locked-loop circuit and further includes:
a count difference circuit having a first input configured to receive a reference count and a second input configured to receive a feedback count, said count difference circuit configured to determine a difference value between the reference count and the feedback count;
a digital to analog converter circuit configured to convert the difference value to said first signal; and
a cycle counter circuit configured to count a number of cycles of the output clock signal within one cycle of a reference frequency signal to generate said feedback count.

8. The circuit of claim 7, wherein said locked-loop circuit further includes a further filter circuit configured to filter said difference value.

9. The circuit of claim 7, wherein said delta-sigma modulator circuit includes a first input configured to receive a clock signal and a second input configured to receive said modulation profile.

10. The circuit of claim 9, wherein said clock signal is a frequency divided version of said output clock signal.

11. The circuit of claim 9, wherein said clock signal is said reference frequency signal.

12. A circuit, comprising:
a locked-loop circuit including:
an oscillator configured to generate an output clock signal having a frequency set by an oscillator control signal;
a modulator circuit having a first input configured to receive a first signal and a second input configured to receive a second signal, said modulator circuit configured to generate a control signal having a value modulated in response to said first and second signals; and
a filter circuit configured to generate said oscillator control signal by filtering the control signal; and
a delta-sigma modulator circuit configured to modulate the second signal in response to a modulation profile so that said output clock signal is a spread spectrum clock signal,
wherein said modulator circuit comprises:
a plurality of current paths;
wherein each current path includes a current source configured to generate a current, wherein the current source is biased by said first signal;
a current summing circuit configured to sum the generated currents from the current paths to output said control signal; and
a switching circuit configured to selectively actuate said current sources in response to said second signal.

13. The circuit of claim 12, wherein said oscillator is a current controlled oscillator responsive to a magnitude of the summed currents.

14. A spread spectrum clock generation circuit, comprising:
a phase-lock-loop circuit including an input configured to receive a reference frequency signal, a phase comparison circuit configured to compare a feedback frequency signal to the reference frequency signal and generate a first oscillator control signal, and an oscillator configured to output a spread spectrum clock signal having a frequency controlled by a second oscillator control signal and phase locked to said reference frequency signal; and
a sigma delta modulator circuit having an input configured to receive a modulation profile signal, said sigma delta modulator circuit configured to apply a modulation to said first oscillator control signal in response to said modulation profile signal to generate said second oscillator control signal.

15. The spread spectrum clock generation circuit of claim 14, wherein said oscillator is a current controlled oscillator and further including a current modulator circuit configured to generate a current control signal as said second oscillator control signal, wherein a magnitude of the current control signal is modulated by said modulation applied by the sigma delta modulator circuit.

16. The spread spectrum clock generation circuit of claim 15, wherein said current modulator circuit comprises:
a plurality of current paths;
wherein each current path includes a current source configured to generate a current, wherein the current source is biased by the first oscillator control signal;
a current summing circuit configured to sum the generated currents from the current paths to output said current control signal; and
a switching circuit configured to selectively actuate said current sources in response to said modulation applied by the sigma delta modulator circuit.

17. The spread spectrum clock generation circuit of claim 14, wherein a clock signal for said sigma delta modulator circuit is a frequency divided version of said spread spectrum clock signal.

18. The spread spectrum clock generation circuit of claim 14, wherein said clock signal for said sigma delta modulator circuit is said reference frequency signal.

19. A spread spectrum clock generation circuit, comprising:
a frequency-lock-loop circuit including an input configured to receive a reference frequency signal, a frequency comparison circuit configured to compare a feedback frequency signal to the reference frequency signal and generate a first oscillator control signal, and an oscillator configured to output a spread spectrum clock signal having a frequency controlled by a second oscillator control signal and frequency locked to an integer multiple of said reference frequency signal; and a sigma delta modulator circuit having an input configured to receive a modulation profile signal, said sigma delta modulator circuit configured to apply a modulation to said first oscillator control signal in response to said modulation profile signal to generate said second oscillator control signal.

20. The spread spectrum clock generation circuit of claim 19, wherein said oscillator is a current controlled oscillator and further including a current modulator circuit configured to generate a current control signal as said second oscillator control signal, wherein a magnitude of the current control signal is modulated by said modulation applied by the sigma delta modulator circuit.

21. The spread spectrum clock generation circuit of claim 20, wherein said current modulator circuit comprises:
a plurality of current paths;
wherein each current path includes a current source configured to generate a current, wherein the current source is biased by the first oscillator control signal;
a current summing circuit configured to sum the generated currents from the current paths to output said current control signal; and
a switching circuit configured to selectively actuate said current sources in response to said modulation applied by the sigma delta modulator circuit.

22. The spread spectrum clock generation circuit of claim 19, wherein a clock signal for said sigma delta modulator circuit is a frequency divided version of said spread spectrum clock signal.

23. The spread spectrum clock generation circuit of claim 19, wherein said clock signal for said sigma delta modulator circuit is said reference frequency signal.

24. A circuit, comprising:
a locked-loop circuit including:
a comparison circuit configured to compare a reference frequency signal to a feedback signal and output a first oscillator control signal;
a modulator circuit having a first input configured to receive the first oscillator control signal and a second input configured to receive a modulation control signal, said modulator circuit configured to generate a second oscillator control signal by directly modulating the first oscillator control signal in response to said modulation control signal;
a sigma delta modulator circuit configured to generate the modulation control signal in response to a continuously varying modulation profile;
a filter circuit configured to generate a third oscillator control signal by filtering the second oscillator control signal;
an oscillator configured to generate an output clock signal in response to said third oscillator control signal, said output clock signal having a spread spectrum set by the continuously varying modulation profile; and
a feedback circuit configured to generate the feedback signal from the output clock signal.

25. The circuit of claim 24, wherein the continuously varying modulation profile is a triangular waveform.

26. The circuit of claim 24, wherein a clock signal for said sigma delta modulator circuit is a frequency divided version of said output clock signal.

27. The circuit of claim 24, wherein a clock signal for said sigma delta modulator circuit is said reference frequency signal.

28. The circuit of claim 24, wherein the locked-loop circuit is a phase locked loop circuit and said comparison circuit comprises a phase comparator configured to compare phases of the feedback signal to said reference frequency signal.

29. The circuit of claim 24, wherein the locked-loop circuit is a frequency locked loop circuit and said comparison circuit comprises a count comparator configured to compare a frequency count of the feedback signal to a frequency count of said reference frequency signal.

30. The circuit of claim 24, further comprising an additional filter configured to filter the first oscillator control signal prior to said modulator circuit.

31. The circuit of claim 23, wherein said modulator circuit comprises:
a plurality of current paths;
wherein each current path includes a current source configured to generate a current, wherein the current source is biased by said first oscillator control signal;
a current summing circuit configured to sum the generated currents from the current paths to output said second oscillator control signal; and
a switching circuit configured to selectively actuate said current sources in response to said modulation control signal.

32. The circuit of claim 31, wherein said oscillator is a current controlled oscillator responsive to a magnitude of the summed currents.

33. The circuit of claim 1, wherein said first oscillator control signal is generated in response to a difference between a reference frequency signal and a frequency divided version of the comparison of the output clock signal.

34. The circuit of claim 33, wherein said difference is a phase difference.

35. The circuit of claim 33, wherein said difference is a frequency difference.

* * * * *